(12) United States Patent
Maynard et al.

(10) Patent No.: US 9,437,432 B1
(45) Date of Patent: Sep. 6, 2016

(54) SELF-COMPENSATING OXIDE LAYER

(71) Applicant: Varian Semiconductor Equipment Associates, Inc., Gloucester, MA (US)

(72) Inventors: Helen L. Maynard, Reading, MA (US); Deven Raj Mittal, Middleton, MA (US); Jun Seok Lee, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/840,932

(22) Filed: Aug. 31, 2015

(51) Int. Cl.
   *H01L 21/336* (2006.01)
   *H01L 21/425* (2006.01)
   *H01L 21/265* (2006.01)

(52) U.S. Cl.
   CPC .................. *H01L 21/2652* (2013.01)

(58) Field of Classification Search
   CPC ........... H01L 21/02658; H01L 21/266; H01L 21/28123; H01L 21/823807; H01L 29/7834
   See application file for complete search history.

(56) References Cited

U.S. PATENT DOCUMENTS

| | | | |
|---|---|---|---|
| 8,778,786 B1 * | 7/2014 | Scudder | H01L 21/266 438/308 |
| 2003/0219940 A1 * | 11/2003 | Hayashi | H01L 21/823857 438/213 |

* cited by examiner

*Primary Examiner* — Pamela E Perkins
(74) *Attorney, Agent, or Firm* — Nields, Lemack & Frame, LLC

(57) ABSTRACT

A method of conformally doping a device on a semiconductor workpiece is disclosed. An oxide layer is applied to all surfaces of the device. Further, the thickness of the oxide layer on each surface is proportional to the energy that ions impact that particular surface. For example, ions strike the horizontal surfaces at nearly a normal angle and penetrate more deeply into the workpiece than ions striking the vertical surfaces. After creating an oxide layer that has a variable thickness, a subsequent dopant implant is performed. While ions strike the horizontal surfaces with more energy, these ions pass through a thicker oxide layer to penetrate the workpiece. In contrast, ions strike the vertical surfaces with less energy, but traverse a much thinner oxide layer to penetrate the workpiece. The result is a conformally doped device.

17 Claims, 5 Drawing Sheets

SELF-COMPENSATING OXIDE LAYER

Embodiments of the present disclosure relate to a method of processing a workpiece, and more particularly, a method of conformally doping a workpiece using an oxide layer.

BACKGROUND

Improvement in fabrication processes for semiconductor devices is a continuous goal. One area that may be improved is the ability to equally dope every surface of a device. For example, in some embodiments, a device, disposed on a workpiece, may be a three-dimensional structure, such as a FinFET, a CIS pixel, or a power device trench transistor. In some cases, it may be advantageous to implant an equal amount of dopant into each surface, including the horizontal surfaces and the vertical surfaces. This is referred to as conformal doping. However, some implant processes tend to implant a greater dose into the horizontal surfaces, due to their orientation.

Further, because the ions that strike the horizontal surfaces tend to impact the surface at an angle that is close to normal, these ions tend to have greater energy and penetrate the workpiece more deeply. In contrast, ions that strike vertical surfaces tend to impact those surfaces at an angle that is far from normal, and as a consequence, penetrate to a much lesser extent.

Another area of improvement may be low energy applications. Ultra shallow junctions are becoming more and more common as geometries continue to shrink. However, some semiconductor fabrication machines, such as plasma doping machines, are more effective at higher energies. These higher energies may implant the dopant deeper in the workpiece than desired.

Another area of improvement may be low dose applications. In plasma implantation, the workpiece is exposed to a plasma containing the dopant species to be implanted. The ions are implanted by applying a voltage to the workpiece, but the dopant species is also incorporated into the workpiece by deposition of neutral species on the surface. The neutral species can be in the initial form, for example, $B_2H_6$, or can be components (radicals) that are dissociated by the plasma, such as, for example, $BH_3$. The tendency for each type of species to deposit depends on its sticking coefficient, which is a measurable, but often unknown quantity. Deposited species can be incorporated into the substrate by ion bombardment (knock in). In some embodiments, a low dose is desirable and it is desirable to limit the amount of dopant incorporated into the substrate and to prevent surface species from being incorporated. A low dose implant may be achieved through tuning of process knobs, such as, for example, dilution of the doping gas with an inert gas, or by physically blocking the incorporation by a thin sacrificial layer, such as a screen oxide or nitride. Such a layer is used to prevent surface deposition from being mixed into the substrate by the ion bombardment.

Therefore, it would be beneficial if there were a method of conformally doping all of the surfaces of a device. It would be beneficial if this method were also applicable to low energy and low dose applications.

SUMMARY

A method of conformally doping a device on a semiconductor workpiece is disclosed. An oxide layer is applied to all surfaces of the device. Further, the thickness of the oxide layer on each surface is proportional to the energy that ions impact that particular surface. For example, ions strike the horizontal surfaces at nearly a normal angle and penetrate more deeply into the workpiece than ions striking the vertical surfaces. After creating an oxide layer that has a variable thickness, a subsequent dopant implant is performed. While ions strike the horizontal surfaces with more energy, these ions pass through a thicker oxide layer to penetrate the workpiece. In contrast, ions strike the vertical surfaces with less energy, but traverse a much thinner oxide layer to penetrate the workpiece. The result is a conformally doped device.

According to one embodiment, a method of doping a workpiece is disclosed. The method comprises applying an oxide layer to the workpiece, where a thickness of the oxide layer on each surface of the workpiece is proportional to the energy at which ions strike that surface during implant; performing an implant of a dopant species to the workpiece after the oxide layer has been applied; and removing the oxide layer after implanting the dopant species. In certain embodiments, the applying is performed by depositing an oxide layer on the workpiece. In certain embodiments, the applying comprises performing an amorphizing implant to the workpiece; and exposing the workpiece to oxygen after the amorphizing implant to create an oxide layer. In some embodiments, the amorphizing implant is performing using germanium, xenon or argon.

According to another embodiment, a method of doping a workpiece is disclosed. The method comprises amorphizing portions of the workpiece by implanting a first species into the workpiece, wherein the implanted portions of the workpiece become amorphized regions and a remainder of the workpiece remains crystalline; exposing the workpiece to oxygen after the amorphizing, wherein the amorphized regions of the workpiece are converted to a silicon oxide layer; implanting a dopant species into the workpiece after the exposing such that the dopant species travel through the silicon oxide layer to reach a crystalline portion of the workpiece disposed beneath the silicon oxide layer; and removing the silicon oxide layer. In some further embodiments, the method further comprises applying a mask to one or more surfaces of the workpiece prior to the amorphizing. In certain embodiments, a thickness of the silicon oxide layer is greater on certain surfaces of the workpiece based on orientation of the surfaces. In certain embodiments, a thickness of the silicon oxide layer on a surface of the workpiece is proportional to an energy at which the first species is implanted into that surface. In certain embodiments, the method further comprises subjecting the workpiece to a thermal treatment after the implanting. In certain embodiments, the thermal treatment is performed prior to removing the silicon oxide layer. In certain embodiments, a depth and concentration of dopant species that is implanted in the crystalline portion of the workpiece are substantially equal for all surfaces of the workpiece.

According to a third embodiment, a method of creating a conformally doped structure on a workpiece is disclosed. The method comprises amorphizing at least one horizontal surface and at least one non-horizontal surface of a structure on a workpiece by implanting a first species into the structure, wherein the implanted regions of the structure become amorphized regions and a remainder of the structure remains crystalline; exposing the structure to oxygen after the amorphizing, wherein the amorphized regions of the structure are converted to a silicon oxide layer; implanting a dopant species into the structure after the exposing such that ions of the dopant species travel through the silicon oxide layer to reach a crystalline portion of the structure disposed beneath the silicon oxide layer; and removing the silicon oxide layer from the structure. In certain embodiments, a thickness of the silicon oxide layer on the horizontal surfaces is greater than a thickness of the silicon oxide layer on the non-horizontal surfaces. In certain embodiments, the structure has desired dimensions and the structure is formed having dimensions different than the desired dimensions to account for removal of the silicon oxide. In certain embodiments, a depth and concentration of dopant species that are implanted in the crystalline portion of the workpiece disposed beneath the silicon oxide layer is substantially equal for all surfaces.

BRIEF DESCRIPTION OF THE FIGURES

For a better understanding of the present disclosure, reference is made to the accompanying drawings, which are incorporated herein by reference and in which.

DETAILED DESCRIPTION

Figure 3:
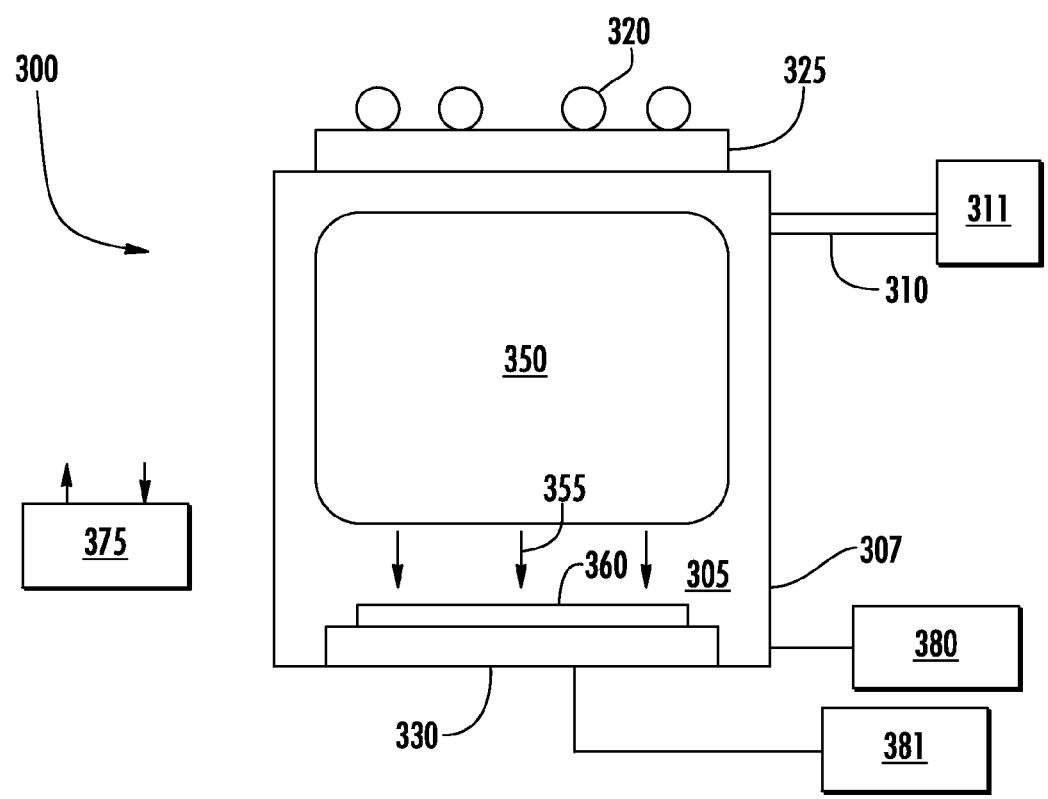
FIG. 3 shows an ion implantation system that may be used in accordance with certain embodiments.

FIG. 3 shows a PLAD implant system 300. In this embodiment, the PLAD implant system 300 includes a chamber 305 defined by several walls 307, which may be constructed from graphite, silicon, silicon carbide, aluminum, or another suitable material. This chamber 305 may be supplied with a feed gas, which is contained in a feed gas source 311, via a gas inlet 310. This feed gas may be energized by a plasma generator. In some embodiments, an RF antenna 320 or another mechanism is used to create plasma 350. The RF antenna 320 is in electrical communication with a RF power supply (not shown) which supplies power to the RF antenna 320. A dielectric window 325, such as a quartz or alumina window, may be disposed between the RF antenna 320 and the interior of the chamber 305. The PLAD implant system 300 also includes a controller 375. The controller 375 may receive input signals from a variety of systems and components and provide output signals to each to control the same.

Ions 355 in the plasma 350, which are positively charged, are attracted to the workpiece 360 by the difference in potential between the chamber 305 (which defines the potential of the plasma 350) and the workpiece 360. In some embodiments, the walls 307 may be more positively biased than the workpiece 360. For example, the walls 307 may be in electrical communication with a chamber power supply 380, which is positively biased. In this embodiment, the workpiece 360 is in communication with a platen 330, which is in communication with bias power supply 381, which is biased at a voltage lower than that applied by chamber power supply 380. In certain embodiments, the bias power supply 381 may be maintained at ground potential. In a second embodiment, the chamber power supply 380 may be grounded, while the bias power supply 381 may be biased at a negative voltage. While these two embodiments describe either the workpiece 360 or the walls 307 being at ground potential, other embodiments are also possible. The ions 355 from the plasma 350 are attracted to the workpiece 360 as long as the walls 307 are biased at any voltage greater than the voltage applied to the platen 330.

The PLAD implant system 300 may use different mechanisms to implant ions into the workpiece 360. One mechanism relies on a subsequent thermal process to drive in ions that become deposited on the surface of the workpiece. For example, ions may be physisorbed or chemisorbed to the workpiece 360. A subsequent anneal process drives those ions, which are attached to the surface of the workpiece, into the workpiece 360. A second mechanism is direct implantation, where the energy of the ions 355 is sufficient to allow them to penetrate the workpiece 360. While most direct ion implantation is performed at angles normal to the workpiece 360, other variations are possible. For example, the plasma sheath may be modified to allow the ions to be attracted to the workpiece 360 at a plurality of incident angles. In addition, other mechanisms, such as sputtering and collisions with other ions or with neutrals, may also allow ions 355 to impact the workpiece 360 at angles that are not normal to the workpiece 360.

In general, the energy of ions that strike horizontal surfaces of the workpiece 360 is greater than that of ions that strike non-horizontal surfaces of the workpiece 360. As a result, a greater concentration of dopant, at a greater depth, is often found on horizontal surfaces of the workpiece 360.

In some embodiments, conformal doping may be achieved by the tuning of various process knobs, such as pressure within the chamber 305, power to the RF antenna 320 and gas flow into the chamber 305. Thus, the present disclosure offers one method of attaining conformal doping of a workpiece within a PLAD implant system 300.

As noted above, a greater concentration of dopant, at a greater depth, is often found on horizontal surfaces of the workpiece 360 than on the non-horizontal surfaces. The present disclosure uses this concept to create an oxide layer that is thicker on those surfaces where the implant energy is greater, and thinner on those surfaces where the implant energy of the ions is lower. By introducing an oxide layer of varying thickness, a subsequent ion implant may uniformly dope the surfaces of the workpiece beneath the oxide layer.

FIGS. 1A-1F show a sequence of processes that may be used to create a conformally doped three-dimensional structure on a workpiece.

Figure 1A:
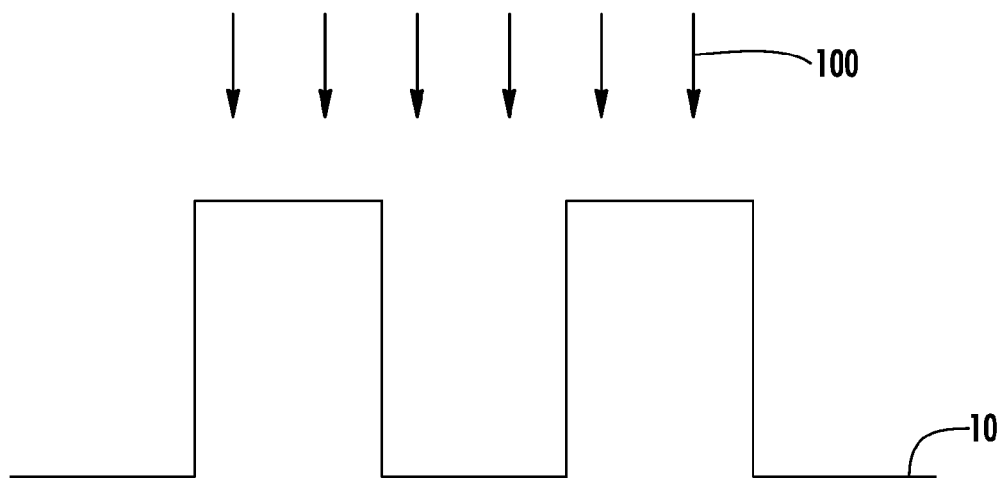
FIGS. 1A-1F show a sequence of processes that may be performed according to one embodiment.

As shown in FIG. 1A, a workpiece 10 may have three dimensional structures disposed thereon. The three dimensional structures may include one or more horizontal surfaces 11a and one or more non-horizontal surfaces 11b. While FIG. 1A shows the non-horizontal surfaces 11b as being vertical, it is understood that, in other embodiments, these non-horizontal surface 11b may be slanted. Similarly, while horizontal surfaces 11a are shown as being perfectly horizontal, it is understood that the horizontal surfaces 11a are simply those surfaces that are more horizontal than the non-horizontal surfaces 11b.

An amorphizing implant 100 is performed on the workpiece 10. This amorphizing implant 100 may be performed using an amorphizing species that is heavier than the material used for the workpiece 10. For example, if the workpiece 10 is silicon, the amorphizing species may be germanium, argon or xenon, although other species may also be used. In other embodiments, lighter species, such as hydrogen or helium, may be used. This amorphizing implant 100 may be a high dose implant, such as, for example, greater than 1e15 ions/cm$^2$. The dose needed to amorphize a material is greater for lighter species, as is known to those skilled in the art. Similarly, the dose may be greater for a thicker desired amorphization depth.

Figure 1B:
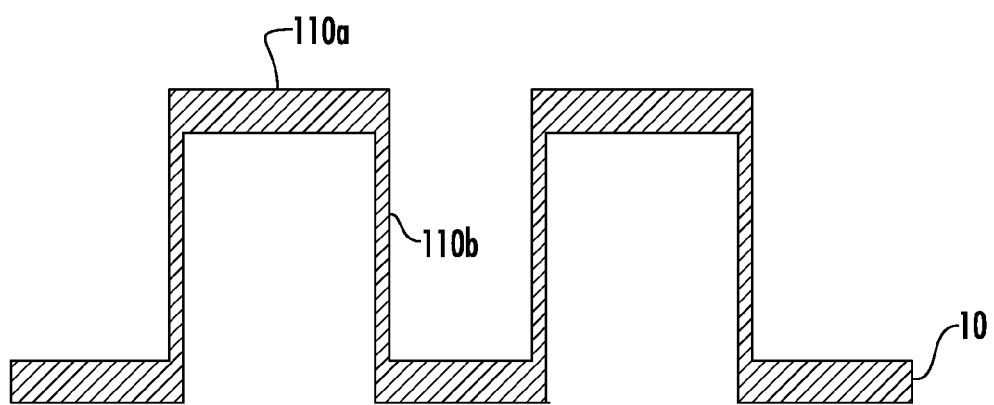
Figure 1C:
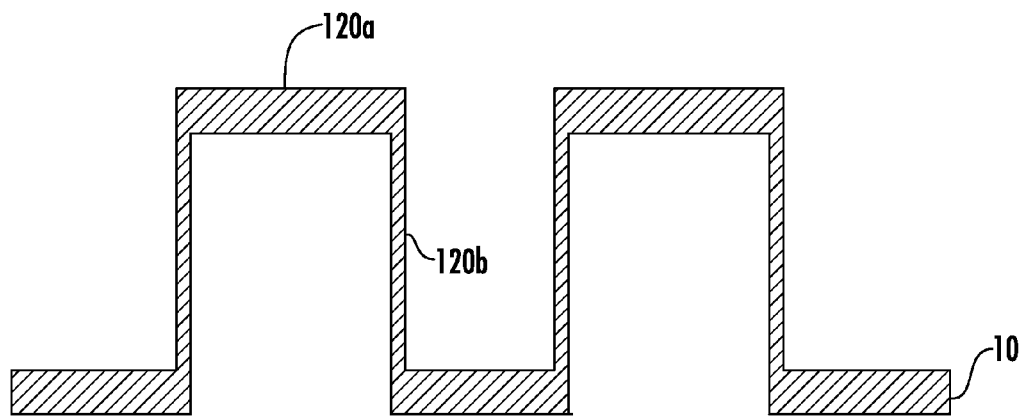

After the amorphizing implant 100 has been performed, certain portions of the workpiece 10 are amorphized. FIG. 1B shows the amorphized regions 110a that are formed on the horizontal surfaces 11a and the amorphized regions 110b that are formed on the non-horizontal surfaces 11b. The amorphized regions 110a, 110b are formed at the surface of the workpiece 10 and extend varying depths into each surface of the workpiece 10. Note that the amorphized regions 110a are thicker than the amorphized regions 110b. This may be due to the orientation of the respective surfaces. Since the horizontal surfaces 11a receive more direct ion implantation, the energy of the amorphizing species that strike these surfaces cause those amorphizing species to penetrate more deeply. While FIGS. 1A-1F show only two orientations of the surfaces (i.e. horizontal and vertical), it is understood that the workpiece may have any number of different orientations. Further, it may be expected that the thickness of the amorphized region on each of these differently oriented surfaces would be different, where the surface which is closest to being horizontal would have the thickest amorphized region. Further, the thickness of the amorphized region may be proportional to the energy of the ions that strike that surface during an implant process.

Next, after the amorphizing implant 100, the workpiece 10 is exposed to oxygen. The oxygen reacts with the silicon to form silicon oxide. However, the rate of reaction of oxygen and amorphized silicon is much greater than the rate of reaction of oxygen and crystalline silicon. In other words, amorphous silicon converts much more readily to silicon oxide than crystalline silicon. The rate of oxidation slows considerably upon reaching the amorphous-crystalline interface. Thus, the oxidation process may be self-limiting, such that the amorphized regions 110a, 110b are converted to silicon oxide, but the underlying crystalline silicon is not affected. The exposure to oxygen converts amorphized regions 110a, 110b into silicon oxide layers 120a, 120b. Note that, like the amorphized regions, the silicon oxide layer 120a disposed on the horizontal surface 11a is thicker than the silicon oxide layer 120b disposed on the non-horizontal surface 11b. As noted above, the thickness of the silicon oxide layer on a particular layer may be proportional to the energy of the ions that strike that surface during the amorphizing implant 100. In certain embodiments, the thickness of the silicon oxide layer on a particular surface is equal to the thickness of the previously amorphized region on that surface. Beneath the silicon oxide layer 120a, 120b is crystalline silicon.

Figure 1D:
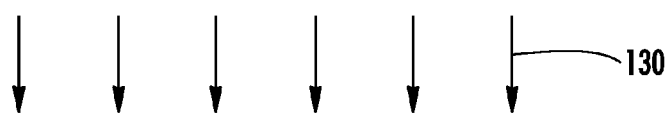
Figure 1D:
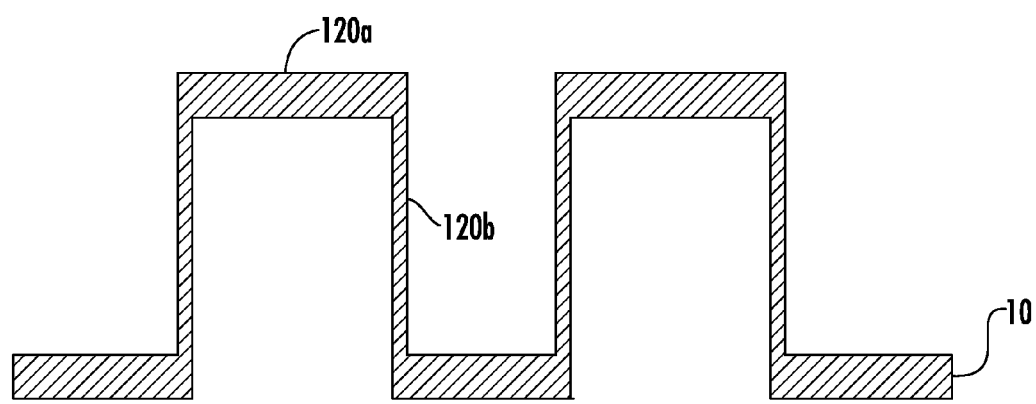

In FIG. 1D, an implant of a dopant species 130 is performed. Since this implant may be performed in the same or a similar PLAD implant system, such as that shown in FIG. 3, the resulting implant characteristics may be similar to that of the amorphizing implant 100. In other words, the implant energies of the ions of the dopant species 130 that strike the horizontal surfaces 11a and the non-horizontal surfaces 11b may be similar to those experienced during the amorphizing implant 100. Thus, the ions of the dopant species 130 may penetrate the workpiece 10 to a level slightly deeper than the silicon oxide layer 120a, 120b, regardless of the surface orientation. Note that the total depth of dopant penetration is different for horizontal surfaces 11a and non-horizontal surfaces 11b. However, the distance that the ions of the dopant species 130 penetrate beneath the respective silicon oxide layer 120a, 120b may be roughly the same on these surfaces. In other words, the distance that the ions of the dopant species penetrate the crystalline silicon beneath the silicon oxide layer 120a, 120b is roughly equal. Further, the concentration of ions of the dopant species 130 that are implanted in the crystalline silicon is substantially equal for all surfaces.

Figure 1E:
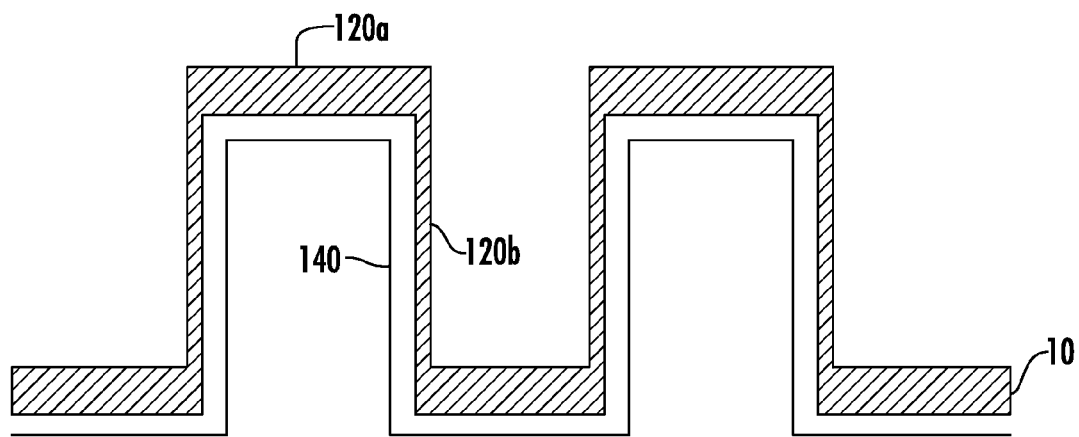

FIG. 1E shows the resulting workpiece 10 after the implant of the dopant species 130. A doped region 140, which is nearly uniform in thickness, is created beneath the silicon oxide layer 120a, 120b in the crystalline portion on all surfaces of the workpiece 10. Further, the concentration of dopant species 130 is nearly uniform in all surfaces of the workpiece 10. Note that since the silicon oxide layer 120a is thickest where the ions of the dopant species 130 impact with the greatest energy, this silicon oxide layer 120a serves as a barrier to the dopant species 130. In contrast, since the silicon oxide layer 120b is much thinner, the silicon oxide layer 120b offers much less resistance to ions of the dopant species 130 that impact the non-horizontal surfaces 11b.

The silicon oxide layer 120a, 120b created using an amorphizing implant 100 may be a self-compensating technique that normalizes all surfaces of a workpiece. As described above, the thickness of the silicon oxide layer on a particular surface is proportional to the energy of the ions that impact that surface, which may be a function of the orientation of that surface. When a subsequent implant of the dopant species 130 is performed, that implant has similar characteristics regarding orientation and implant energy. As a result, the use of two implants, where the first is used to create a variable thickness silicon oxide barrier, and the second is used to dope the workpiece, may result in a conformally doped workpiece.

Figure 1F:
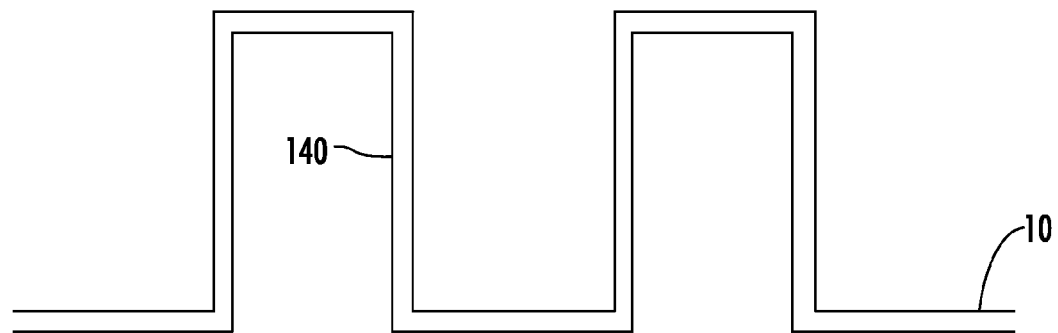

In FIG. 1F, the silicon oxide layer 120a, 120b is removed, leaving the doped region 140 adjacent to the surfaces of the workpiece 10. The silicon oxide layer 120a, 120b may be removed using HF, or any other suitable compound or technique.

After this sequence is completed, the workpiece 10 may be subjected to a thermal treatment, such as an anneal process.

In certain embodiments, it may be beneficial to leave the silicon oxide layer 120a, 120b on the workpiece 10 during subsequent processes. For example, in certain embodiments, it may be beneficial to leave the silicon oxide layer 120a, 120b in place to prevent outdiffusion of the dopant, improving retained dose. The presence of the silicon oxide layer 120a, 120b may also prevent or reduce further oxidation during a subsequent anneal process. Thus, in certain embodiments, the workpiece 10 may be subjected to additional processes, such as a thermal treatment prior to the removal of the silicon oxide layer 120a, 120b.

Note that this sequence results the removal of material from all surfaces of the workpiece 10. Furthermore, the amount of material that is removed is non-uniform, as more material is removed from horizontal surfaces 11a than from non-horizontal surfaces 11b. As a result, the dimensions of the conformally doped structure on the workpiece 10 may be different after this sequence is completed. In certain embodiments, when the structures are being formed on the workpiece 10 (i.e. before FIG. 1A), the subsequent non-uniform removal of material is taken into account. For example, the desired dimensions of a structure may be X nm high by Y nm wide. However, since the sequence of FIGS. 1A-1F removes $Z_1$ nm from the horizontal surfaces 11a and $Z_2$ nm from the non-horizontal surfaces 11b, where $Z_1$ is greater than $Z_2$, the structure may be initially formed with an initial size of $X+Z_1$ nm high by $Y+2*Z_2$ nm wide. For example, a FinFET may have a desired width of about 15 nm wide, a CIS Pixel may have a desired width of about 1 micron wide and a power device trench transistor may have a desired width of about 50 microns wide. In each of these structures, the ratio of the height of the structure to its width (i.e. aspect ratio) may be about 5:1. The thickness of the structure that may be removed in the sequence shown in FIGS. 1A-1F may be about 5 nm on the horizontal surfaces 11a, and less, such as 2 nm, on the non-horizontal surfaces 11b. In the case of a FinFET, having desired ending dimensions of 75 nm high by 15 nm wide, the initial structure may be formed having dimensions of 80 nm by 19 nm wide before processing. This allows the resulting structure on the workpiece to have the desired dimensions after the sequence shown in FIGS. 1A-1F is completed.

Figure 2:
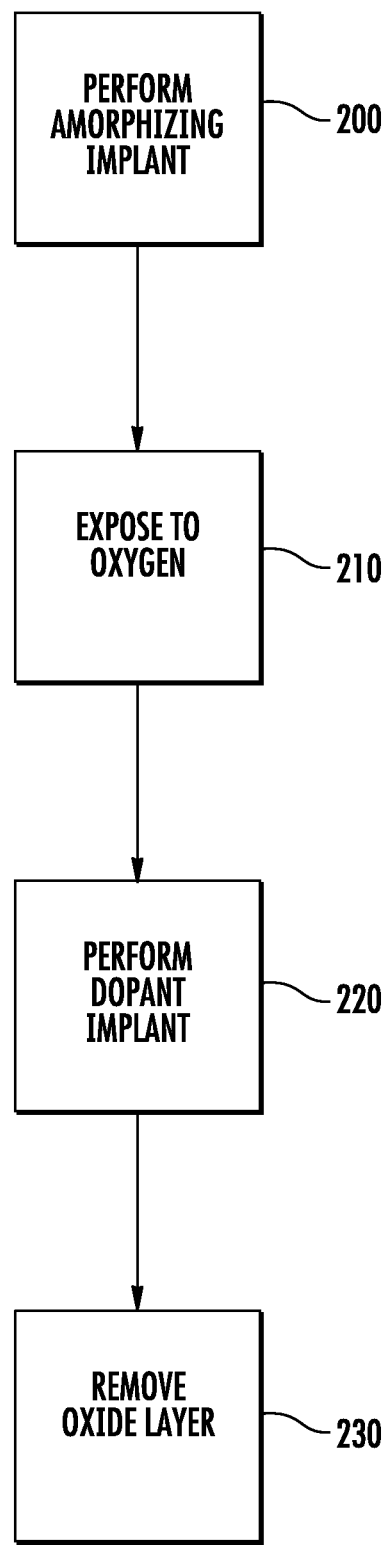
FIG. 2 is a flowchart showing the sequence of FIGS. 1A-1F.

FIG. 2 shows a flowchart of the processes illustrated in FIGS. 1A-1F. As shown in Process 200, an amorphizing implant is first performed. As described above, the thickness of the amorphized region on a particular surface is related to the orientation of that surface.

Next, as shown in Process 210, the workpiece is exposed to oxygen, where the amorphized silicon readily converts to silicon oxide, forming an oxide layer on all surfaces of the workpiece. The thickness of the silicon oxide layer may be nearly the same as the thickness of the previously created amorphized regions. Thus, the thickness of the oxide layer on a particular surface is also related to the orientation of that surface.

After exposure to oxygen, an implant of a dopant species is then performed, as shown in Process 220. As described above, the ions of the dopant species that pass through the oxide layer are ultimately implanted in the workpiece.

Finally, as shown in Process 230, the oxide layer is removed. As described above, it may be advantageous to perform one or more processes on the workpiece prior to the removal of the oxide layer. In other words, the workpiece 10 may be subjected to one or more processes after the dopant implant (Process 220) and prior to the removal of the oxide layer (Process 230).

In certain embodiments, the processes described above are performed in a cluster tool, such that the two implants and the exposure to oxygen are performed without breaking vacuum. In certain embodiments, two or more of these processes are performed in the same chamber by changing the feed gas or other process parameters. For example, after performing the amorphizing implant, oxygen may be introduced into the PLAD chamber to form the oxide layer. During this time, the antenna may be disabled. Subsequently, a dopant species may be introduced as the feed gas and the antenna may be activated to perform the dopant implant.

This sequence can be used to create various semiconductor structures, including, but not limited to CIS (CMOS image sensors), STI (shallow trench isolation), DTI (deep trench isolation), power circuits, logic circuits, memory devices or MEMS devices.

While the disclosure describes the creation of an oxide layer using an amorphizing implant, other embodiments are also possible. For example, the oxide layer may be applied by depositing the oxide on the workpiece during a deposition process.

The embodiments described above in the present application may have many advantages. As described above, as geometries get smaller, the ability to conformally dope a structure on a workpiece becomes more beneficial. The present embodiment describes a technique that is self-compensating. Because the amorphized region is created using the same process that is used for the dopant implant (i.e. an implant process within a PLAD implant system), its implant pattern and behavior is similar. In other words, the thickness of the amorphized regions on each surface will be proportional to the energy of the ions that strike that surface. Consequently, the thickness of the oxide layer is variable as a function of surface orientation and is empirically created. Similarly, the depth to which the dopant ions penetrate the workpiece is also a function of the surface orientation. These two implants tend to normalize the effects of surface orientation such that the implanted dopant is conformally doped.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of doping a workpiece having at least two surfaces of different orientations, comprising:
   applying an oxide layer to the at least two surfaces of the workpiece, where a thickness of the oxide layer on each surface of the workpiece is proportional to an energy at which ions strike that surface during implant and wherein a thickness of the oxide layer is greater on one of the at least two surfaces of the workpiece due to the orientation of the one surface;
   performing an implant of a dopant species to the workpiece after the oxide layer has been applied; and
   removing the oxide layer after implanting the dopant species.

2. The method of claim 1, wherein the applying is performed by depositing an oxide on the workpiece.

3. The method of claim 1, wherein the applying comprises:
   performing an amorphizing implant to the workpiece; and
   exposing the workpiece to oxygen after the amorphizing implant to create an oxide layer.

4. The method of claim 3, wherein the amorphizing implant is performing using germanium, xenon or argon.

5. A method of doping a workpiece, comprising:
   amorphizing portions of the workpiece by implanting a first species into the workpiece, wherein implanted portions of the workpiece become amorphized regions and a remainder of the workpiece remains crystalline;
   exposing the workpiece to oxygen after the amorphizing, wherein the amorphized regions of the workpiece are converted to a silicon oxide layer, wherein a thickness of the silicon oxide layer is greater on certain surfaces of the workpiece based on orientation of the surfaces;
   implanting a dopant species into the workpiece after the exposing such that the dopant species travel through the silicon oxide layer to reach a crystalline portion of the workpiece disposed beneath the silicon oxide layer; and
   removing the silicon oxide layer.

6. The method of claim 5, further comprising applying a mask to one or more surfaces of the workpiece prior to the amorphizing.

7. The method of claim 5, wherein a thickness of the silicon oxide layer on a surface of the workpiece is proportional to an energy at which the first species is implanted into that surface.

8. The method of claim 5, further comprising subjecting the workpiece to a thermal treatment after the implanting.

9. The method of claim 8, wherein the thermal treatment is performed prior to the removing.

10. The method of claim 5, wherein a depth and concentration of dopant species that is implanted in the crystalline portion of the workpiece are substantially equal for all surfaces of the workpiece.

11. The method of claim 5, wherein the first species comprises germanium, xenon argon, helium or hydrogen.

12. A method of creating a conformally doped structure on a workpiece, comprising:
   amorphizing at least one horizontal surface and at least one non-horizontal surface of a structure on a workpiece by implanting a first species into the structure, wherein implanted regions of the structure become amorphized regions and a remainder of the structure remains crystalline;
   exposing the structure to oxygen after the amorphizing, wherein the amorphized regions of the structure are converted to a silicon oxide layer;
   implanting a dopant species into the structure after the exposing such that ions of the dopant species travel through the silicon oxide layer to reach a crystalline portion of the structure disposed beneath the silicon oxide layer; and
   removing the silicon oxide layer from the structure.

13. The method of claim 12, wherein a thickness of the silicon oxide layer on the at least one horizontal surface is greater than a thickness of the silicon oxide layer on the at least one non-horizontal surface.

14. The method of claim 12, wherein the structure has desired dimensions and the structure is formed having dimensions different than the desired dimensions to account for removal of the silicon oxide layer.

15. The method of claim 12, further comprising subjecting the workpiece to a thermal treatment after the implanting.

16. The method of claim 15, wherein the thermal treatment is performed prior to the removing.

17. The method of claim 12, wherein a depth and concentration of dopant species that are implanted in the crystalline portion of the workpiece disposed beneath the silicon oxide layer is substantially equal for all surfaces.

* * * * *